(12) United States Patent
Kessler et al.

(10) Patent No.: US 12,027,436 B2
(45) Date of Patent: Jul. 2, 2024

(54) PACKAGE WITH CLIP HAVING THROUGH HOLE ACCOMMODATING COMPONENT-RELATED STRUCTURE

(71) Applicant: Infineon Technologies AG, Neubiberg (DE)

(72) Inventors: Angela Kessler, Sinzing (DE); Kok Yau Chua, Melaka (MY); Josef Hoeglauer, Heimstetten (DE); Chiah Chin Lim, Muar (MY); Mei Qi Tay, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 206 days.

(21) Appl. No.: 17/575,038

(22) Filed: Jan. 13, 2022

(65) Prior Publication Data

US 2022/0254696 A1 Aug. 11, 2022

(30) Foreign Application Priority Data

Feb. 10, 2021 (DE) ..................... 10 2021 103 050.1

(51) Int. Cl.
| | |
|---|---|
| *H01L 29/06* | (2006.01) |
| *H01L 21/52* | (2006.01) |
| *H01L 23/31* | (2006.01) |
| *H01L 23/495* | (2006.01) |
| *H01L 23/538* | (2006.01) |
| *H01L 31/072* | (2012.01) |
| *H01L 31/109* | (2006.01) |

(52) U.S. Cl.
CPC .......... *H01L 23/3157* (2013.01); *H01L 21/52* (2013.01); *H01L 23/49541* (2013.01); *H01L 23/5384* (2013.01)

(58) Field of Classification Search
CPC .......... H01L 23/3157; H01L 23/49541; H01L 23/5384
USPC .......................................................... 257/15
See application file for complete search history.

(56) References Cited

U.S. PATENT DOCUMENTS

| | | | |
|---|---|---|---|
| 9,437,528 B1 | 9/2016 | Gong et al. | |
| 9,461,009 B1 | 10/2016 | Higgins, III et al. | |
| 2014/0232015 A1* | 8/2014 | Otremba | H01L 23/28 257/777 |
| 2017/0373055 A1* | 12/2017 | Shiraishi | H01L 29/66734 |
| 2019/0259689 A1* | 8/2019 | Lui | H05K 1/0265 |
| 2019/0311977 A1 | 10/2019 | Lam | |
| 2020/0098870 A1 | 3/2020 | Estacio et al. | |

* cited by examiner

*Primary Examiner* — Jami Valentine Miller
*Assistant Examiner* — Dilinh P Nguyen
(74) *Attorney, Agent, or Firm* — Dicke, Billig & Czaja, PLLC (57) ABSTRACT

A package and method of manufacturing is disclosed. In one example, the package which comprises a carrier with at least one component mounted on the carrier. A clip is arranged above the carrier and having a through hole. At least part of at least one of the at least one component and/or at least part of an electrically conductive connection element electrically connecting the at least one component is at least partially positioned inside the through hole.

20 Claims, 5 Drawing Sheets

PACKAGE WITH CLIP HAVING THROUGH HOLE ACCOMMODATING COMPONENT-RELATED STRUCTURE

CROSS-REFERENCE TO RELATED APPLICATION

This Utility Patent Applications claims priority to German Patent Application No. 10 2021 103 050.1, filed Feb. 10, 2021, which is incorporated herein by reference.

BACKGROUND

Technical Field

Various embodiments relate generally to a package, an electronic device, and a method of manufacturing a package.

Description of the Related Art

Packages may be denoted as usually encapsulated electronic components with electrical connects extending out of the encapsulant. For example, packages may be connected to an electronic periphery, for instance mounted on a printed circuit board and/or connected with a heat sink, and may be connected via connectors to a larger system.

Packaging cost is an important driver for the industry. Related with this are performance, dimensions and reliability. The different packaging solutions are manifold and have to address the needs of a specific application.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

There may be a need for a compact package with high reliability and high performance.

According to an exemplary embodiment, a package is provided which comprises a carrier, at least one component mounted on the carrier, and a clip arranged above the carrier and having a through hole, wherein at least part of at least one of the at least one component and/or at least part of an electrically conductive connection element electrically connecting the at least one component is at least partially positioned inside the through hole.

According to another exemplary embodiment, an electronic device is provided which comprises a package having the above mentioned features, and a mounting base on which the package is mounted.

According to yet another exemplary embodiment, a method of manufacturing a package is provided, wherein the method comprises mounting at least one component on a carrier, arranging a clip, having a through hole, above the carrier, and at least partially positioning at least part of at least one of the at least one component and/or at least part of an electrically conductive connection element electrically connecting the at least one component inside the through hole.

According to an exemplary embodiment, a package is provided having a clip with a through hole for accommodating another constituent of the package, more specifically for accommodating a component-related structure of the package. In particular, such a component-related structure may be a portion of a component itself, i.e. a part of such a component. Additionally or alternatively, such a constituent or component-related structure located at least partially inside the through hole of the clip may be an electrically conductive connection element or part thereof, such as a bond wire or a further clip. Such an electrically conductive connection element may be configured for electrically interconnecting different constituents of the package, including the component. While a portion of the through hole may be filled with at least one component-related structure (which may be at least partially electrically conductive), a rest of the opening or through hole may be filled with dielectric encapsulant material. By providing a clip with a through hole, the freedom of design for arranging various constituents of the package may be increased, since a clip portion may be provided with an opening for accommodating at least part of the mentioned constituent(s) or component-related structure (s) in a space-saving way. In particular, arranging such a constituent in a through hole of a clip may render the package compact and may nevertheless ensure a proper electrical decoupling between the clip and the component-related structure extending into or even through the through hole. Alternatively, it is also possible to electrically couple the constituent(s) through the through hole, for instance with the clip. In view of the compact design of the package, also the length of the electric signal paths may be rendered small. This may result, in turn, in a small energy consumption and therefore an energy-efficient operation of the package. Moreover, signal losses may be kept small. The provision of a clip (i.e. a bulky metal structure with pronounced thickness) for accomplishing an electric coupling of constituents of the package may ensure a direct and/or indirect low ohmic connection, in particular of one or more power devices of the package. Optionally but advantageously, such a clip may also carry out tasks of a redistribution layer, i.e. may redistribute electric signals between different constituents of the package. Advantageously, one or more openings in the clip may provide an accommodation volume for accommodating one or more constituents of the package and may avoid that the clip forms a mechanical obstacle when designing the package.

DESCRIPTION OF FURTHER EXEMPLARY EMBODIMENTS

In the following, further exemplary embodiments of the package, the electronic device, and the method will be explained.

In the context of the present application, the term "package" may particularly denote an electronic member which may comprise one or more components mounted on a carrier. Said constituents of the package may be optionally encapsulated at least partially by an encapsulant. For example, many packages may be manufactured simultaneously as a batch before being separated into individual packages.

In the context of the present application, the term "carrier" may particularly denote a support structure which serves as a mechanical support for the one or more components to be mounted thereon. In other words, the carrier may fulfil a mechanical support function. Additionally or alternatively, a carrier may also fulfill an electrical connection function. A carrier may comprise or consist of a single part, multiple parts joined via encapsulation or other package components, or a subassembly of carriers.

In the context of the present application, the term "component" may in particular encompass a body or an inlay integrated within the package and forming a constituent thereof. For instance, such a component may be an electronic component or a component without electronic functionality, for example a cooling body (for instance made of metal) or even an electrically insulating body (for instance made of a ceramic).

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated. Semiconductor chips implemented according to exemplary embodiments may be formed for example in silicon technology, gallium nitride technology, silicon carbide technology, etc.

In the context of the present application, the term "clip" may particularly denote a three-dimensionally curved plate-shaped connection element which comprises an electrically conductive material (such as copper) and which may be an integral body with sections to be connected to one or more electronic component terminals and to the carrier. In particular, such a clip may have two sections to be connected to an upper main surface of the respective electronic component and an upper main surface of the carrier, wherein the two mentioned sections are interconnected, for instance by a slanted, stepped or vertical connection section.

In the context of the present application, the term "through hole" may in particular denote an opening or a recess formed in the clip and extending entirely through the clip. In particular, such a through hole may be surrounded along its entire perimeter by clip material. For example, the at least one through hole of the clip may be manufactured by stamping or etching.

In the context of the present application, the term "electrically conductive connection element" may in particular denote, in addition to the clip, at least one further electrically conductive connection structure electrically connecting the mounted electronic component(s), instance with each other and/or with the carrier. For example, the electrically conductive connection element may comprise at least one of the group consisting of a further clip, and a wire bond (for instance shaped as a ribbon bond). In particular, it is possible to use a wire bond or ribbon bond which is a flexible electrically conductive wire or ribbon shaped body having one end portion connected to the upper main surface of the respective (in particular electronic) component and having an opposing other end portion being electrically connected to the carrier, or being connected to another component.

In the context of the present application, the term "mounting base" may in particular denote a support body on which the package may be assembled, for instance together with one or more further packages. In particular, such a support body may be mechanically and electrically coupled with the package(s). In particular, the mounting base may be a plate-shaped electronic mounting base, such as a printed circuit board (PCB). An electric connection between mounting base and package may be established by a connection medium, such as a solder or sinter material.

In an embodiment, the clip is mounted on and electrically connected with the carrier. For instance, a bottom surface of a section of the clip may be electrically and mechanically connected with a top surface of the carrier for establishing an electrically conductive connection between carrier and clip.

In an embodiment, the clip is mounted on and electrically connected with at least one of the at least one component. In particular, a bottom surface of a further section of the clip may be electrically and mechanically connected with an upper main surface of the component (such as a semiconductor chip) for establishing an electrically conductive connection between carrier and component.

Referring to the previously described embodiments, the clip may form an electrically conductive connection between (in particular electrically conductive) component and (in particular electrically conductive) carrier.

In an embodiment, the at least one component comprises at least one of the group consisting of at least one electronic component, at least one active component, at least one passive component, at least one semiconductor chip, at least one power component, at least one driver component, at least one thermally conductive and/or electrically conductive block or bar, and a pillar. It is also possible that a plurality of components are present in the package, for instance one interconnected using the clip and another one being arranged at least partially within the through hole of the clip.

In an embodiment, the at least one component experiences a vertical current flow during operation. This may keep the electric connection paths short. For the example of a field effect transistor chip, electric current may flow between a drain pad on one main surface of the power component through semiconductor material of the power component to another pad at an opposing other main surface of the power component. At said opposing main surface of the power component, a source pad and a gate pad may be formed.

In an embodiment, the package comprises an encapsulant at least partially encapsulating at least one of the at least one component, the carrier, the electrically conductive connection element (if present), and the clip. In the context of the present application, the term "encapsulant" may particularly denote a substantially electrically insulating and preferably thermally conductive material surrounding at least part of a component and at least part of a carrier, as well as a part of the clip(s). For instance, the encapsulant may be a mold compound and may be created for example by transfer molding. Alternatively, the encapsulant may be a casting compound formed by casting.

In an embodiment, a surface portion of the clip is exposed with respect to the encapsulant. This may allow to electrically couple the electrically conductive clip with an electronic periphery of the package or with a further component of the package, for instance by soldering or sintering. Additionally or alternatively, exposing a clip surface may promote the heat removal capability of the package, since such an exposed surface may efficiently guide heat out of the package towards an exterior. As a consequence, the thermal performance of the package may be significantly improved.

In an embodiment, the package comprises a further component, in particular a passive component, more particularly an inductor component, mounted on top of the clip. Hence, the clip may execute multiple functions. Apart from electrically interconnecting different constituents of the package and serving—by its through hole—as an accommodation volume for a constituent or component-related structure of the package, the clip may also form a mounting surface for a further component such as a passive component of the package. Such a multi-function clip may allow to increase the electrical performance of the package while keeping it compact. For instance, such an inductor-type passive component may be the largest constituent or member of the package in terms of volume and/or weight. Mounting such a bulky inductor-type passive component on top of the rest of the package, a high compactness may be obtained, and in particular a small footprint of the package in the horizontal plane.

In an embodiment, the further component is mounted on the surface portion of the clip being exposed with respect to the encapsulant. Hence, both an interior and an exterior of the package may be used for surface mounting and/or embedding of components.

In an embodiment, the package comprises a metal block mounted on the carrier. Such a metal block, or alternatively ceramic block, may promote heat removal out of the package. When embodied as metal block, said metal block may also contribute to the electronic functionality of the package.

In an embodiment, the further component is mounted on a surface portion of the metal block being exposed with respect to the encapsulant. Thus, the method block may establish an electrically conductive connection of the component mounted on the block.

In particular, a first terminal of the further component is mounted on the exposed surface of the clip, whereas a second terminal of the component is mounted on the exposed surface of the metal body. By taking this measure, the further component may be electrically connected between metal body and clip, while being carried by encapsulant material in between the exposed surface portions of metal body and clip.

In an embodiment, the at least one component comprises a first power component, a second power component, and a driver component. For instance, the power components may be semiconductor power components, such as transistor chips (which may for instance be field effect transistor chips and/or bipolar transistor chips) or diode chips. The driver component may be a logic chip or a controller chip for controlling the power components. At least part of the mentioned components may be active chips.

In an embodiment, the at least one component comprises at least one passive component. Hence, in addition to the at least one active chip, one or more passive components, such as capacitances, ohmic resistances, inductances, etc., may be provided.

Active components may be elements or devices which are capable of providing or delivering energy to the circuit (for instance a transistor). Passive components may be devices which do not require any external source for the operation and are capable of storing energy in the form of voltage or current in the circuit (for example a capacitance).

In an embodiment, the electrically conductive connection element being at least partially located in the through hole of the clip comprises at least one of the group consisting of at least one bond wire or bond ribbon, and at least one further clip. Such an at least one electrically conductive connection element, in particular at least one bond wire or at least one clip, may electrically couple (in particular electronic) components with each other and/or with the carrier and may be at least partially encapsulated by an encapsulant. The described embodiment enables a compact design of different electrically conductive connection elements within the package.

In an embodiment, the at least part of at least one of the at least one component and/or the at least part of the electrically conductive connection element protrudes vertically into, in particular above, the through hole. Thus, the electrically conductive constituent or component-related structure of the package which is accommodated at least partially in the through hole of the clip may even extend vertically above the clip. For example, such a constituent or component-related structure may be located partially below the clip, partially above the clip, and partially within the through hole of the clip. This may make it possible to guide such an electrically conductive constituent completely through the through hole, which may also enable a connection of said electrically conductive constituent above the clip.

In an embodiment, the electrically conductive connection element electrically connects at least one of the at least one component with the carrier and/or with another one of the at least one component. An electronic component being electrically connected by the clip may be different from or may be the same electronic component which is at least partially located inside of the through hole of the clip.

In an embodiment, the clip spans or extends spatially over an entire area of at least one of the at least one component. For example, a component mounted on the carrier may be located completely within an outline of the clip in a top view. In particular, a three-dimensionally bent clip may extend over such a large dimension in a horizontal plane that the mentioned component is entirely accommodated below said clip.

In an embodiment, the clip comprises at least one lateral recess accommodating at least part of at least one of the at least one component. Such a lateral excess may extend into an edge of the clip (as for instance in FIG. 6) and/or into a corner of the clip (as for example in FIG. 11). While a through hole may be surrounded by clip material along the entire perimeter of the through hole, a recess may be formed in an exterior edge region of clip. For instance, such a recess may be a notch. Also lateral side portion of the clip may thus be used for accommodating one or more other constituents of the package.

In an embodiment, the clip comprises at least one further through hole. In other words, a plurality of through holes may be formed in the clip, wherein at least two of said through holes may be filled at least partially with a respective constituent or component-related structure of the package or part thereof. This may further reduce the space consumption of the package.

In an embodiment, at least one of the at least one component is a bare die. By embodying the at least one component as a non-encapsulated chip, i.e. a pure semiconductor chip without additional dielectric encapsulant, the compactness of the package may be further enhanced.

In an embodiment, the carrier is electrically coupled with the (in particular electronic) component. Hence, apart from serving as a mechanical carrier, the carrier may also establish an electric connection with an electronic component. This may allow to directly electrically connect a portion of the carrier extending beyond the encapsulant with a pad of the mounting base. For instance, the carrier may be metallic.

In an embodiment, the package comprises an electrically conductive connection medium by which the clip, the carrier and/or the component(s) are interconnected. The connection medium may for instance be a solder structure (in particular for diffusion soldering), a sinter structure (for instance comprising silver sinter material), or an adhesive (in particular an electrically conductive glue).

In an embodiment, the package comprises a plurality of (in particular electronic) components mounted on the carrier or on different carriers. Thus, the package may comprise one or more electronic components (for instance at least one passive component, such as a capacitor, and at least one active component, such as a semiconductor chip).

For example, the package may comprise two semiconductor power chips (for instance two field effect transistor chips), one driver chip (or logic chip), and four passive components (which may comprise at least one inductor). For example, the driver chip may be arranged in a flip chip configuration. It is possible that one of the semiconductor power chips is arranged face up and the other one is arranged face down. Pads of the various chips may be interconnected by the carrier, by the clip, and/or by one or more additional electrically conductive connection elements (such as one or more additional clips, bond wires, etc.).

In an embodiment, the electronic device comprises a mounting base (such as a printed circuit board, PCB) on which the package is mounted and being electrically coupled with leads of the package and/or with the carrier. Such a mounting base may be an electronic board serving as mechanical base for the package and being electrically couplable with the.

Preferably, the carrier is a printed circuit board. In other embodiments, the carrier forms part of a metal plate or forms part of a leadframe. However, it is also possible that the carrier comprises a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer). In particular, the carrier may be a Direct Copper Bonding (DCB) substrate or a Direct Aluminium Bonding (DAB) substrate. However, the carrier may also be configured as Active Metal Brazing (AMB) substrate, or as patterned metal plate (for example a leadframe).

Preferably, at least one electronic component is a power semiconductor chip. For instance, a corresponding power semiconductor application may be realized by the chip(s), wherein integrated circuit elements of such a power semiconductor chip may comprise at least one transistor (in particular a field effect transistor such as a MOSFET (metal oxide semiconductor field effect transistor) or a bipolar transistor such as an IGBT (insulated gate bipolar transistor)), at least one diode, etc. It is also possible that the at least one electronic component comprises a controller circuit, a driver circuit, etc. One or more of these and/or other circuits may be integrated into one semiconductor chip, or separately in different chips. In particular, packages fulfilling a half-bridge function, a full-bridge function, etc., may be manufactured. In another embodiment, the at least one electronic component may be a logic die.

In an embodiment, the package is configured as power converter, in particular one of an AC/DC power converter and a DC/DC power converter. However, also other electronic applications, such as inverters, etc., may be possible.

As substrate or wafer for the semiconductor chips, a semiconductor substrate, in particular a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching, laser removal), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

A disadvantage of conventional modules with passive components (for instance an inductor) next to a power stage or chip set is a large outline and a long current path which leads to less efficiency.

According to an exemplary embodiment, a package or module with small outline is provided which results from the fact that a clip is provided with a through hole and at least one constituent or component-related structure of the package is at least partially located inside of the through hole. An advantage of such a package, for instance with passive component(s) (for example an inductor) next to a power stage or chip set is a smaller outline and a shorter current path which leads to enhanced efficiency.

Optionally, a passive component such as an inductor may be arranged on top of the package, preferably without increasing the dimension of the package outline in a horizontal plane.

For instance, a package according to an exemplary embodiment may be embodied as voltage converter. More particularly, a package for DC/DC conversion may be provided with an advantageously small form factor and a high efficiency. Advantageously, this can be furthermore combined with the integration of one or more passive components for additional gain of space on a mounting base (such as a board). An improvement of efficiency of such an embodiment may provide a highly advantageous package.

A package architecture according to an exemplary embodiment may allow to provide a high peak efficiency and a high load efficiency with a module in which power stage and passive components may be combined to one package or module.

Advantageously, an exemplary embodiment allows to realize a module construction with small width which leads to a small pitch on the mounting base.

More specifically, an exemplary embodiment mounts a chip set (for example with MOSFETs and driver, passives (like capacitor, resistor and/or others)) and a copper block on a PCB. Those constituents may be overmolded, and an inductor may be optionally mounted on top. This may enable to stack passive components in the power stage and thus may allow to realize a small outline.

Furthermore, a package according to an exemplary embodiment may use bare dies, wherein a clip can be mounted on top thereof. The obtained structure may be overmolded, grinded, and a passive component such as an inductor may be mounted on top.

This enables to stack the passive component (such as an inductor) on top of the package in order to achieve a small outline. Furthermore, it may be possible to use bare dies instead of pre-encapsulated chips in order to further reduce space and again keep the outline small.

Highly advantageously, a clip having at least one through hole may form part of the package, wherein said through hole may be used for accommodating one or more other package constituents (such as at least part of a component, at least part of an electrically conductive connection element such as a bond wire, etc.). By taking this measure, the package design may be further miniaturized, the energy consumption may be reduced, and the signal losses may be suppressed due to short electrical connections.

A further advantage of the package or module design according to exemplary embodiments is an excellent electrical performance of the module, especially at higher load, and in particular due to the described construction of the clip and its interaction with other package constituents. The clip area may be preferably as large as possible and may for example have a thickness of at least 200 µm (for example approximately 250 µm) and may therefore offer a large copper volume for low electric and thermal resistance. This large clip area can be used particularly advantageously when it is realized with an opening above pads of an electronic component (for instance a high-side semiconductor transistor chip) and corresponding driver pads in order to do wire bonding between both dies. A small outline may be achieved due to the use of bare dies (smaller than implementing package-type electronic components being already encapsulated at the point of time of chip assembly). A further component, in particular electronic component, more particularly passive component (such as a coil-type inductor) may be mounted on top of the package or module. Preferably, a printed circuit board may be used as carrier which may allow to realize an improved footprint for a mounting base of an electronic component. Nevertheless, other carriers such as a leadframe may be possible in other embodiments as well. However, selecting a printed circuit board as the carrier of the package may allow to realize a particularly advantageous dimension of the package.

Moreover, it may be possible to mount various electronic components, such as passive components, MOSFETs and a driver on the carrier. Furthermore, it may be possible to mount a metal block (such as a copper block) on the carrier. The above-mentioned driver may be mounted face down on the PCB-type carrier, for instance using copper pillars. A high-side MOSFET may be mounted with its drain pad on the PCB-type carrier, whereas source pad and gate pad may face to the top side. A low-side MOSFET may be mounted face down on the PCB-type carrier. Gate pad and source pad of the low-side MOSFET may face the PCB-type carrier, whereas the drain pad may be arranged face up. Furthermore, it may be possible to attach a clip on the top of high-side drain pad and the low-side source pad. The clip area may be selected larger than the area above the MOSFETs, and the clip may be also placed above the rest of the PCB area. A resulting advantage is a lower resistance and a more homogenous current flow. Advantageously the clip may have an opening or through hole for accommodating at least one package constituent, preferably for wire bonding between high-side chip and driver chip. An obtained interim construction may be encapsulated, in particular overmolded by a mold compound. Advantageously, the clip may be constructed in such a way that with grinding or grooving of the mold compound, a surface of the clip may be exposed at the top side. This may provide an area where an inductor pad for a switch may be needed. A metal block may be constructed in such a way that with grinding or grooving of the mold compound, it may be exposed at the top side providing an area where an inductor pad for an outlet voltage may be arranged. These exposed areas can be larger than the pad dimension of the inductor. Preferably, the grooving can be done in such a way that the rotation of the inductor is reduced. An inductor may be mounted on top of the obtained package.

Advantageously, the high efficiency of a correspondingly manufactured package combined with a small package outline may give a benefit to the electronic device of a specific application. In particular, it may be possible to place the device with a better electrical performance nearer to a central processing unit (CPU) of the electronic device.

A gist of an exemplary embodiment is the overall construction of the module, Especially the usage of bare dies which are partly flipped, a large switch clip with opening, and the stacking with the inductor on top are advantageous features of such a package. Advantageously, an exemplary embodiment may implement a clip geometry with an opening for accommodating at least part of an electronic component (in particular a passive component) and/or an electrically conductive contact element (for example one or more wire bonds).

Figure 1:
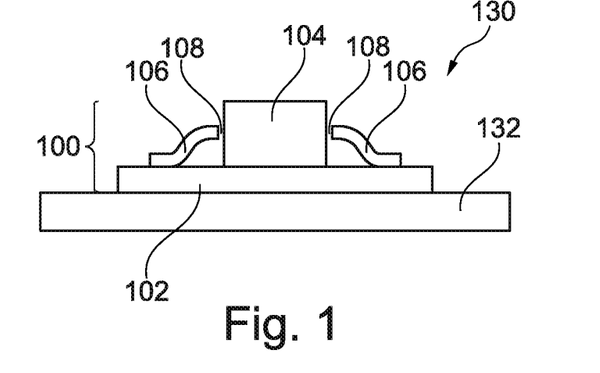
FIG. 1 illustrates a schematic cross-sectional view of an electronic device with a package according to an exemplary embodiment.

FIG. 1 illustrates a cross-sectional view of an electronic device 130 comprising a package 100 according to an exemplary embodiment.

The illustrated package 100 comprises a carrier 102 and a component 104 mounted on the carrier 102. A clip 106 is arranged above the carrier 102 and has a through hole 108.

A part of the component 104 is positioned inside the through hole 108.

Moreover FIG. 1 shows electronic device 130 which comprises the described package 100 and a mounting base 132 on which the package 100 is mounted.

Figure 2:
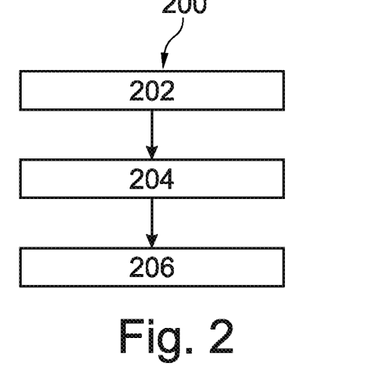
FIG. 2 illustrates a flowchart of a method of manufacturing a package according to an exemplary embodiment.

FIG. 2 illustrates a flowchart 200 of a method of manufacturing a package 100 according to an exemplary embodiment. The reference signs used for the following description of said manufacturing method relate to the embodiment of FIG. 1.

Referring to a block 202, the method comprises mounting a component 104 on a carrier 102.

Referring to a block 204, the method further comprises arranging a clip 106, having a through hole 108, above the carrier 102.

Referring to a block 206, the method additionally comprises partially positioning the component 104 inside the through hole 108.

Figure 3:
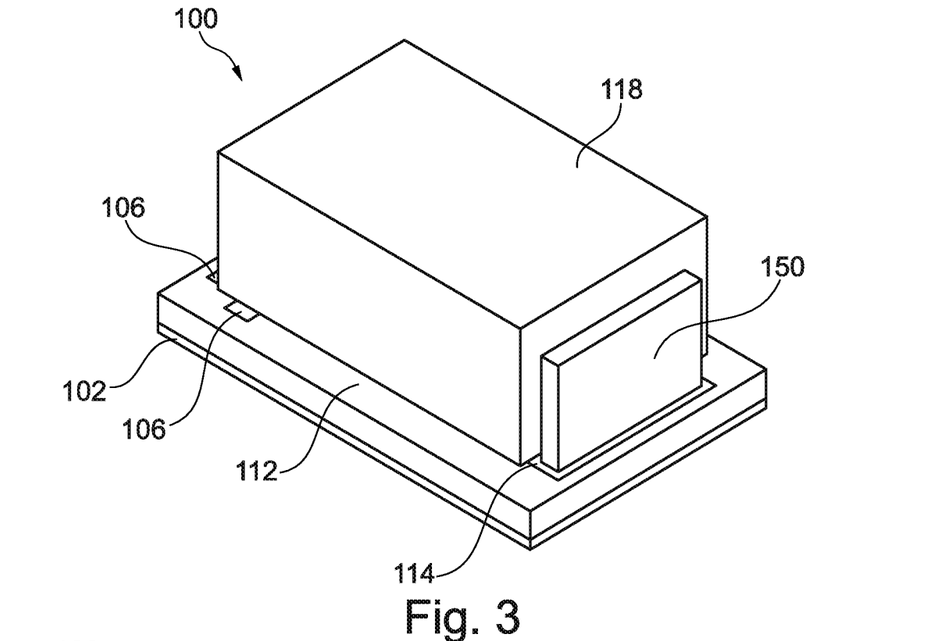
FIG. 3 illustrates a three-dimensional view of an encapsulated package with surface-mounted passive component according to an exemplary embodiment.
Figure 4:
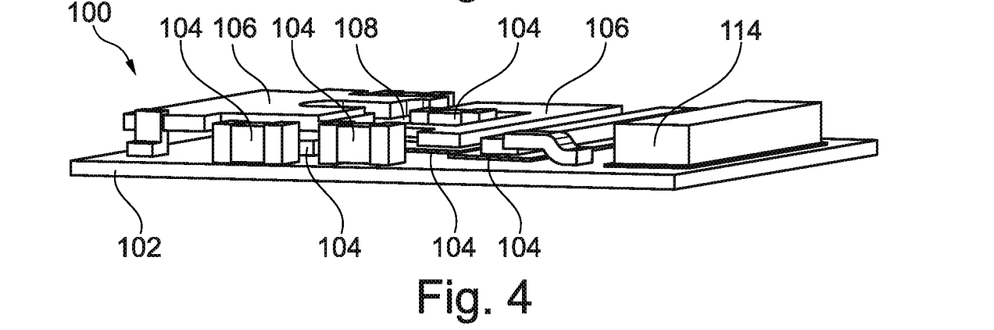
FIG. 4 illustrates a side view of the package according to FIG. 3 without encapsulant and without surface-mounted passive component.
Figure 5:
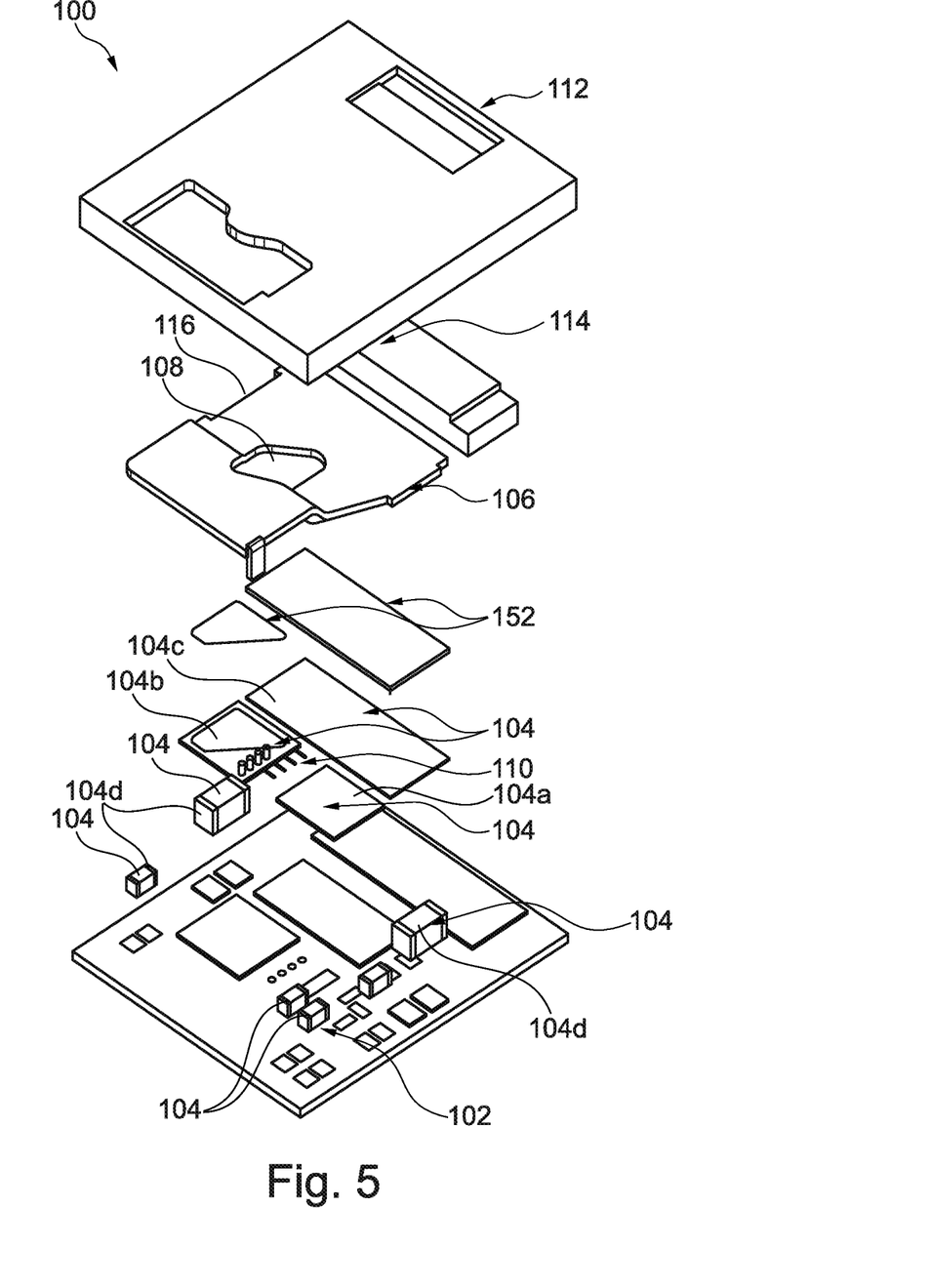
FIG. 5 illustrates an exploded view of the package according to FIG. 3 without surface mounted passive component.
Figure 6:
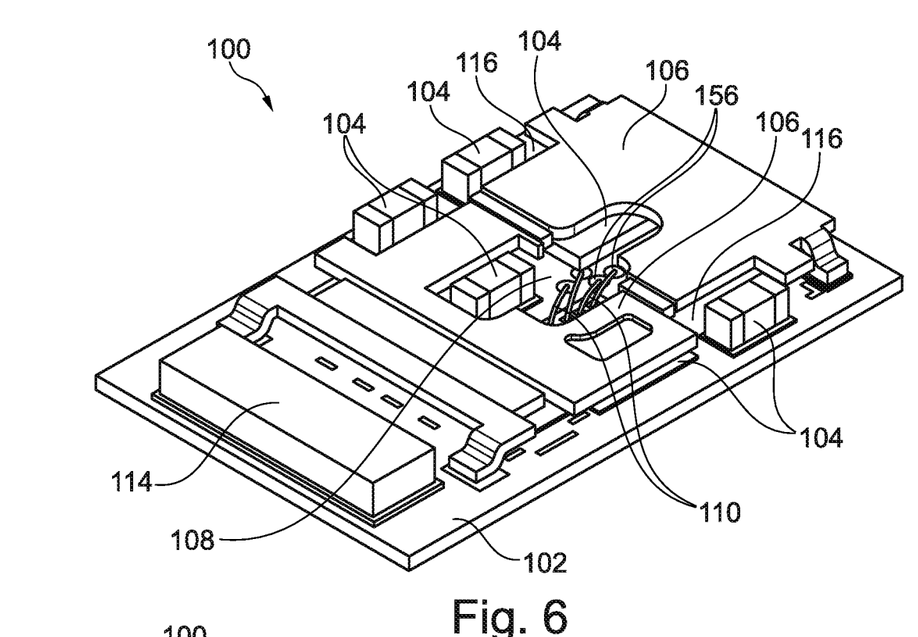
FIG. 6 illustrates a three-dimensional view of the package according to FIG. 4.
Figure 7:
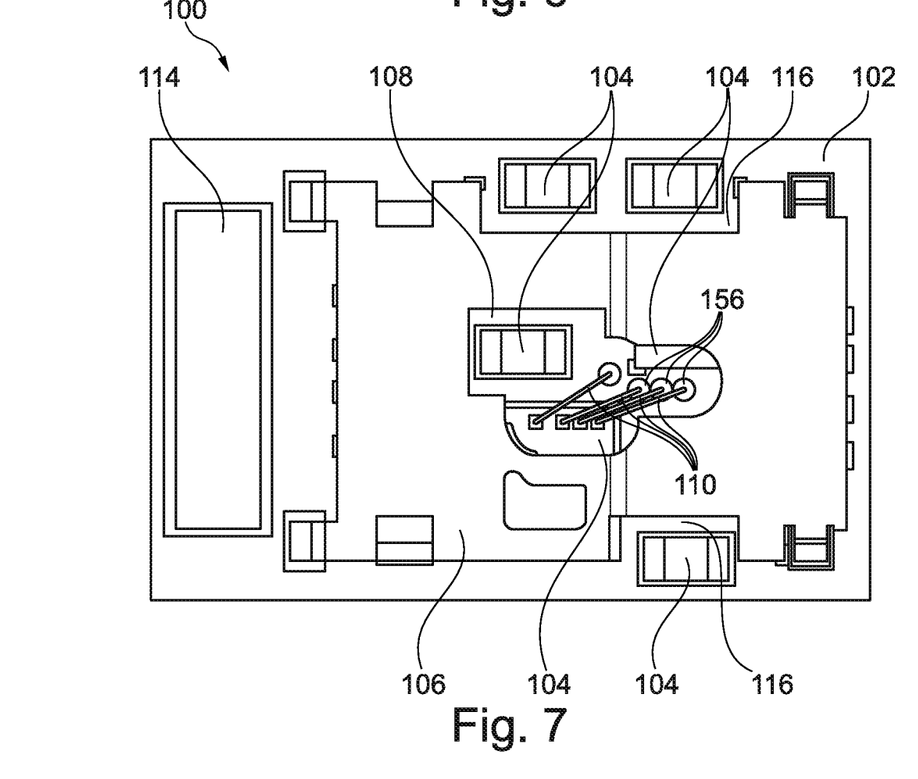
FIG. 7 illustrates a plan view of the package according to FIG. 4.
Figure 8:
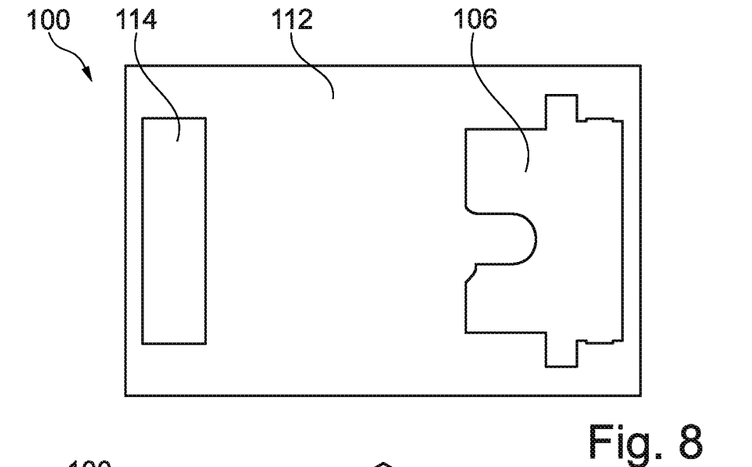
FIG. 8 illustrates a plan view of the package according to FIG. 7 with encapsulant.

FIG. 3 illustrates a three-dimensional view of an encapsulated semiconductor power package 100 according to an exemplary embodiment with surface-mounted passive component 118. FIG. 4 illustrates a side view of the package 100 according to FIG. 3 without encapsulant 112 and without surface-mounted passive component 118. FIG. 5 illustrates an exploded view of the package 100 according to FIG. 3 without surface mounted passive component 118. FIG. 6 illustrates a three-dimensional view of the package 100 according to FIG. 4 without encapsulant 112 and without surface-mounted passive component 118. FIG. 7 illustrates a plan view of the package 100 according to FIG. 4 without encapsulant 112 and without surface-mounted passive component 118. FIG. 8 illustrates a plan view of the package 100 according to FIG. 7 with encapsulant 112 and without surface-mounted passive component 118.

Now referring to FIG. 3 to FIG. 8 in further detail, construction of semiconductor package 100 will be described. A bottom of the package 100 is constituted by a carrier 102, which may be a printed circuit board (PCB). The PCB-type carrier 102 comprises dielectric FR4 material as well as horizontal and vertical copper structures. Although a PCB-type carrier 102 may be preferred, other carriers may be used as well, such as a leadframe or a ceramic plate covered on both opposing main surfaces thereof with a respective metallic layer.

A plurality of electronic components 104 are mounted on the carrier 102. As illustrated in FIG. 5, these components 104 include semiconductor chips in form of a driver chip 104a (which may be flipped), a high-side transistor chip as first power component 104b, and a low-side transistor chip as second power component 104c (which may be flipped). Each of the active components 104a, 104b, 104c may be embodied as a bare semiconductor die. This may contribute to the compactness of the package 100.

As indicated with reference signs 152 in FIG. 5, solder may be printed on the respective electronic component 104 for creating a respective solder connection.

Apart from the described active components 104a, 104b, 104c, passive components 104d are also surface-mounted on the carrier 102. All components 104 may be mounted in an electrically conductive way of the carrier 102, for instance by soldering.

Moreover, a bent plate-shaped metallic clip 106 (for instance made of copper material) may be arranged above the carrier 102. Clip 106 may be embodied as a bent and structured metal plate and has a central opening or through hole 108. For example, the through hole 108 may be formed by punching or etching. The clip 106 may be mounted in an electrically conductive way on the carrier 102, for instance by soldering. Hence, the clip 106 is mechanically mounted on and electrically connected with the carrier 102.

Electrically conductive connection elements 110, here embodied as bond wires made of gold and having a thickness of 25 µm, may establish an electrically conductive connection between various constituents of the package 100, in particular between the electronic components 104a and 104b. For this purpose, the electrically conductive connection elements 110 may be soldered between pads (see reference signs 156 in FIG. 6 and FIG. 7) of the respective electronic components 104a and 104b. It is also possible that the electrically conductive connection elements 110 electrically connect a respective component 104 with the carrier 102.

As best seen in FIG. 4, FIG. 6 and FIG. 7, central parts or portions of the electrically conductive connection elements 110 are located or positioned inside the opening or through hole 108 of the clip 106. By taking this measure, the open volume related to the through holes 108 of the clip 106 may be used for accommodating parts of the electrically conductive connection elements 110. Furthermore, one of the passive components 104d extends partially into the through hole 108 (compare FIG. 4). This contributes additionally to a space-saving configuration and thus a compact design of the package 100. Moreover, taking this measure may keep the electric paths within the package 100 short, which reduces energy consumption, parasitic heating and deterioration of signal quality.

Although not shown, it is optionally possible to provide not only one, but a plurality of through holes 108 in the clip 106, wherein each through hole may be at least partially filled with a metallic constituent of the package 100. Additionally or alternatively, it is also possible that one or more through holes 108 in the clip 106 are at least partially filled with one or more other electrically conductive constituents of the package 100, for instance with at least one further clip (not shown) and/or with any of the active components 104a, 104b, 104c or part thereof.

Furthermore, it is possible that the clip 106 is mounted on and/or is electrically connected with one or more of the electronic components 104. As seen in FIG. 4 to FIG. 7, the clip 106 spans over several of the electronic components 104 in a lateral direction or in the horizontal plane. Beyond this, the clip 106 comprises lateral recesses 116 accommodating parts of some of the passive components 104d (see FIG. 6 and FIG. 7). This also contributes to a compact design of the package 100.

As can be taken from FIG. 4 to FIG. 8, the package 100 additionally comprises a metal bar or block 114 (such as a copper block or alternatively one or more copper pillars) which is mounted on the PCB-type carrier 102, for instance by soldering. The metal block 114 may be used for establishing additional electrically conductive connections within the package 100.

As best seen in FIG. 3, FIG. 5 and FIG. 8, the package 100 is overmolded by a mold compound functioning as an encapsulant 112 which encapsulates part of the carrier 102, the components 104, the electrically conductive connection elements 110, as well as parts of the clip 106 and part of the metal block 114. A portion of the respective upper main surfaces of the clip 106 and of the metal block 114 are however exposed to an environment, see FIG. 8. The exposed surfaces of the clip 106 and of the metal block 114 as well as an upper main surface of the encapsulant 112 may be aligned, i.e. may form a common planar upper surface. This simplifies assembly of a further component 118 on top thereof. The exposed portion of the clip 106 and/or of the metal block 114 may also protrude vertically beyond the encapsulant 112.

The exposed electrically conductive surfaces of the clip 106 and the metal block 114 extending out of the encapsulant 112 can serve as connection surfaces for a surface-mounted further component 118, here embodied as a passive component such as an inductor component. Hence, the further component 118 may be mounted on and electrically coupled with a top of the clip 106 and a top of the metal body 114, for example by soldering. Furthermore, the further component 118 rests on a top surface of the encapsulant 112. As seen in FIG. 3, electrically conductive lead structures 150 may be used for connecting the further component 118 with the exposed surfaces of the clip 106 and the metal body 114. For example, this may be accomplished by creating a solder connection. As shown, the further component 118 is mounted on the surface portion of the clip 106 being exposed with respect to the encapsulant 112. Moreover, the further component 118 is mounted on a surface portion of the metal block 114 being exposed with respect to the encapsulant 112. Thus, the further component 118 may be electrically connected between the clip 106 and the metal body 114. As can be taken from FIG. 3, the further component 118 may be the largest constituent of the package 100 in terms of volume and/or weight. However, the horizontal outline of the further component 118 may be completely inside of the horizontal outline of the carrier 102 and the encapsulant 112. Consequently, the further component 118 does not add anything on the footprint of the package 100 (i.e. its area consumption in the horizontal plane).

Figure 9:
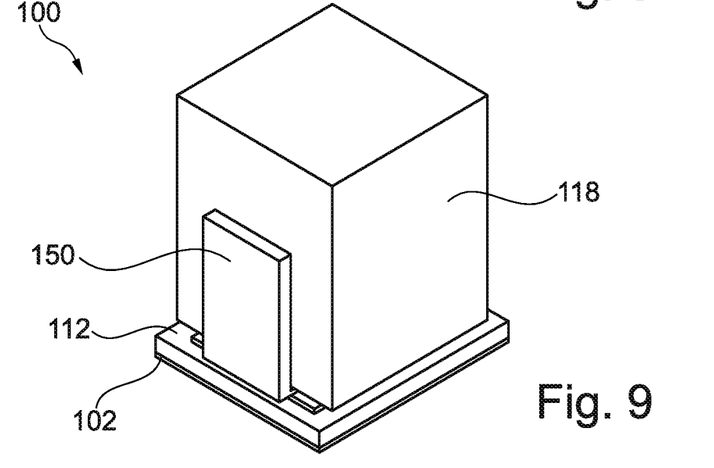
FIG. 9 illustrates a three-dimensional view of a package according to another exemplary embodiment.
Figure 10:
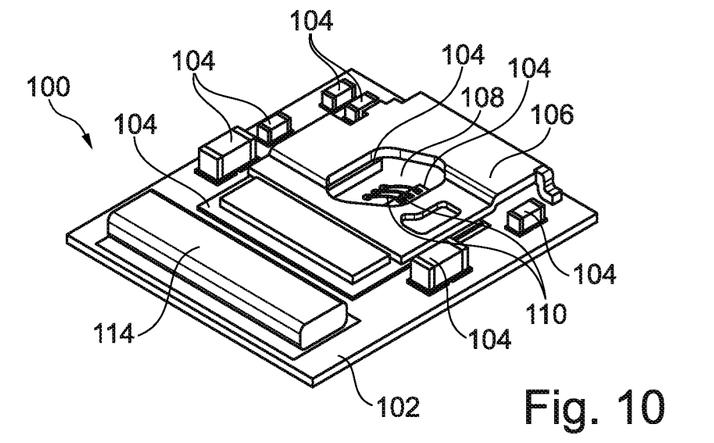
FIG. 10 illustrates a three-dimensional view of the package according to FIG. 9 without encapsulant and without surface-mounted passive component.
Figure 11:
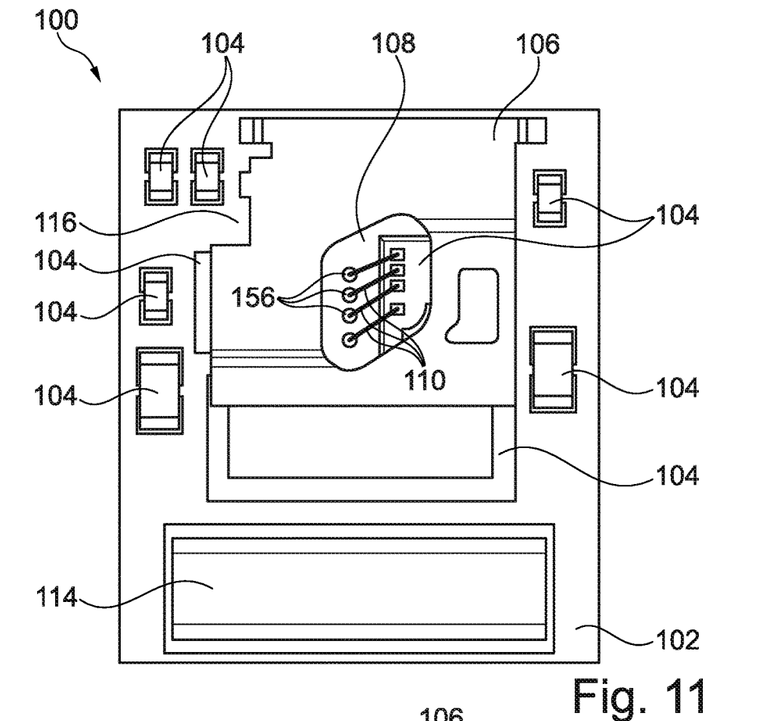
FIG. 11 illustrates a plan view of the package according to FIG. 10.
Figure 12:
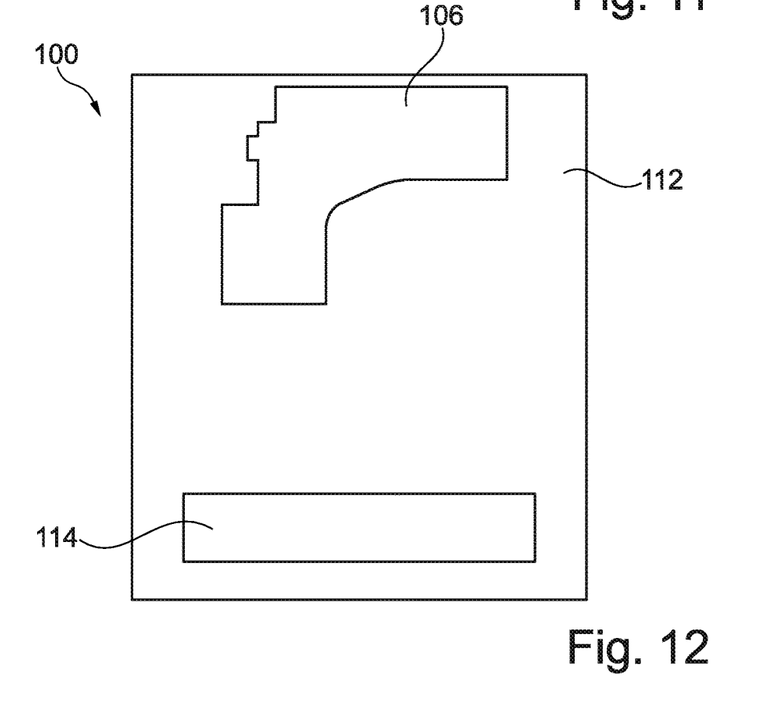
FIG. 12 illustrates a plan view of the package according to FIG. 11 with encapsulant.

FIG. 9 illustrates a three-dimensional view of a package 100 according to another exemplary embodiment. FIG. 10 illustrates a three-dimensional view of the package 100 according to FIG. 9 without encapsulant 112 and without surface-mounted passive component 118. FIG. 11 illustrates a plan view of the package 100 according to FIG. 10 without encapsulant 112 and without surface-mounted passive component 118. FIG. 12 illustrates a plan view of the package 100 according to FIG. 11 with encapsulant 112 and without surface-mounted passive component 118.

The embodiment of FIG. 9 to FIG. 12 illustrates a package with a similar design as in FIG. 3 to FIG. 8 providing corresponding technical advantages. However, while the embodiment of FIG. 3 to FIG. 8 has a rectangular package geometry (seen in particular FIG. 3), the embodiment of FIG. 9 to FIG. 12 has square package dimensions. Furthermore, the embodiment of FIG. 9 to FIG. 12 has a recess 116 in a corner of the clip 106, wherein one of the components 104 is arranged in this recess 116 (compare FIG. 11).

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, wherein the package comprises:
a carrier;
at least one component mounted on the carrier; and
a clip comprising a clip material and arranged above the carrier and having a through hole, the through hole comprising a perimeter entirely surrounded by the clip material;
wherein at least part of at least one of the at least one component is at least partially positioned inside the through hole.

2. The package according to claim 1, wherein the clip is mounted on and electrically connected with the carrier and/or the clip is mounted on and electrically connected with at least one of the at least one component.

3. The package according to claim 1, wherein the at least one component comprises at least one of the group consisting of at least one electronic component, at least one active component, at least one passive component, at least one semiconductor chip, at least one component experiencing vertical current flow during operation, at least one power component, at least one driver component, at least one thermally conductive and/or electrically conductive block, and a pillar.

4. The package according to claim 1, comprising an encapsulant at least partially encapsulating at least one of the at least one component, the carrier, an electrically conductive connection element electrically connecting the at least one component, and the clip.

5. The package according to claim 4, wherein a surface portion of the clip is exposed with respect to the encapsulant.

6. The package according to claim 5, wherein the further component is mounted on the surface portion of the clip being exposed with respect to the encapsulant.

7. The package according to claim 6, wherein the further component is mounted on a surface portion of a metal block being exposed with respect to the encapsulant.

8. The package according to claim 1, comprising a further component, in particular a passive component, more particularly an inductor component, mounted on top of the clip.

9. The package according to claim 1, comprising a metal block mounted on the carrier.

10. The package according to claim 1, comprising at least one of the following features:
wherein the at least one component comprises a first power component, a second power component, and a driver component;
wherein the at least one component comprises at least one passive component.

11. The package according to claim 1, wherein the at least part of the at least one of the at least one component and/or at least part of an electrically conductive connection element electrically connecting the at least one component protrudes vertically into, in particular vertically above, the through hole.

12. The package according to claim 1, wherein an electrically conductive connection element electrically connecting the at least one component comprises at least one of the group consisting of at least one bond wire, and at least one further clip.

13. The package according to claim 1, wherein an electrically conductive connection element electrically connects at least one of the at least one component with the carrier and/or with another one of the at least one component.

14. The package according to claim 1, wherein at least one of the at least one component is located completely within an outline of the clip in a top view.

15. The package according to claim 1, wherein the clip comprises at least one lateral recess, in particular extending into an edge and/or into a corner of the clip, accommodating at least part of at least one of the at least one component.

16. The package according to claim 1, wherein the clip comprises at least one further through hole.

17. The package according to claim 1, wherein at least one of the at least one component is a bare die.

18. The package according to claim 1, wherein at least part of an electrically conductive connection element electrically connecting the at least one component is at least partially positioned inside the through hole.

19. An electronic device, comprising:
    a package according to claim 1; and
    a mounting base on which the package is mounted.
20. A method of manufacturing a package, wherein the method comprises:
    mounting at least one component on a carrier;
    arranging a clip comprising a clip material, having a through hole comprising a perimeter entirely surrounded by the clip material, above the carrier; and
    at least partially positioning at least part of at least one of the at least one component inside the through hole.

* * * * *